(12) United States Patent
Kanai et al.

(10) Patent No.: US 11,921,333 B2
(45) Date of Patent: Mar. 5, 2024

(54) WAVELENGTH-SELECTION TYPE OPTICAL RECEIVING APPARATUS

(71) Applicant: NIPPON TELEGRAPH AND TELEPHONE CORPORATION, Tokyo (JP)

(72) Inventors: Takuya Kanai, Musashino (JP); Takeshi Imai, Musashino (JP); Yumiko Senoo, Musashino (JP); Kota Asaka, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 181 days.

(21) Appl. No.: 17/427,866

(22) PCT Filed: Jan. 31, 2020

(86) PCT No.: PCT/JP2020/003690
§ 371 (c)(1),
(2) Date: Aug. 2, 2021

(87) PCT Pub. No.: WO2020/162360
PCT Pub. Date: Aug. 13, 2020

(65) Prior Publication Data
US 2022/0113478 A1    Apr. 14, 2022

(30) Foreign Application Priority Data
Feb. 5, 2019 (JP) .................... 2019-018954

(51) Int. Cl.
*H04B 10/00* (2013.01)
*G02B 6/42* (2006.01)
*H01L 31/0232* (2014.01)

(52) U.S. Cl.
CPC .......... *G02B 6/421* (2013.01); *G02B 6/4236* (2013.01); *H01L 31/0232* (2013.01)

(58) Field of Classification Search
CPC .. G02B 6/421; G02B 6/4236; G02B 6/29361; G02B 6/29395; G02B 6/4215;
(Continued)

(56) References Cited

U.S. PATENT DOCUMENTS 4,733,094 A * 3/1988 Carpentier ........... G02B 6/4246
257/E33.072
5,432,537 A * 7/1995 Imakawa ................. B41J 2/465
347/135
(Continued)

FOREIGN PATENT DOCUMENTS

JP    200445881 A    2/2004
JP    2005123778 A    5/2005
JP    2009290097 A    12/2009

OTHER PUBLICATIONS

Shunji Kimura, "WDM/TDM-PON Technologies for Future Flexible Optical Access Networks" 15th OptoElectronics and Communications Conference (OECC 2010) Tech. Digest, Jul. 5, 2010, pp. 14-15.
(Continued)

*Primary Examiner* — Agustin Bello
(74) *Attorney, Agent, or Firm* — Harness, Dickey & Pierce, P.L.C.

(57) ABSTRACT

A wavelength-selective optical reception device includes a photoreceptor (21) that converts optical signals (201) into electric signals and outputs the electric signals, a base (31) on which the photoreceptor (21) is provided, a housing (41) that is mounted on the base (31) and surrounds the photoreceptor (21) along with the base (31), and that is provided with a window (51) to pass optical signals (203) including the optical signals (201) and including optical signals (202) of a wavelength different from a first wavelength of the optical signals (201) and a window (52) to pass the optical signals (202), and an optical filter (61) that is disposed inside
(Continued)

the housing between the window (51) and the photoreceptor (21) along the optical axis (205) of the optical signals (203), and that outputs, out of the optical signals (203) that enter thereto, the optical signals (201) toward the photoreceptor (21), and reflects the optical signals (202) toward a near side in a direction of travel of the optical signals (203).

20 Claims, 8 Drawing Sheets

(58) Field of Classification Search
CPC .............. G02B 6/4246; H01L 31/0232; H01L 31/0203; H01L 31/02325
See application file for complete search history.

(56) References Cited

U.S. PATENT DOCUMENTS

| | | | | |
|---|---|---|---|---|
| 5,485,538 | A * | 1/1996 | Bowen | G02B 6/4246 385/10 |
| 5,528,407 | A * | 6/1996 | Nakata | G02B 6/4206 398/139 |
| 5,696,862 | A * | 12/1997 | Hauer | G02B 6/4246 385/88 |
| 5,970,190 | A * | 10/1999 | Fu | G02B 6/29329 385/37 |
| 6,008,920 | A * | 12/1999 | Hendrix | G02B 6/29367 398/79 |
| 6,449,066 | B1 * | 9/2002 | Arns | G02B 6/29397 359/566 |
| 6,480,331 | B1 * | 11/2002 | Cao | G02F 1/093 359/489.05 |
| 6,525,846 | B1 * | 2/2003 | Yan | G01J 3/0259 359/566 |
| 6,587,481 | B1 * | 7/2003 | Seong | G11B 7/123 |
| 6,868,055 | B2 * | 3/2005 | Ueyama | G11B 7/0901 |
| 6,983,005 | B2 * | 1/2006 | Masui | G11B 7/1353 |
| 6,999,661 | B2 * | 2/2006 | Plickert | G02B 6/29368 385/38 |
| 7,440,163 | B1 * | 10/2008 | Zhou | G02B 6/4246 359/333 |
| 7,505,647 | B2 * | 3/2009 | Goebel | G02B 6/4246 385/24 |
| 7,889,993 | B2 * | 2/2011 | Wang | H04B 10/40 398/138 |
| 7,911,922 | B2 * | 3/2011 | Masui | G11B 7/1353 369/112.04 |
| 8,265,486 | B2 * | 9/2012 | Lim | H04B 10/40 398/139 |
| 8,380,075 | B2 * | 2/2013 | Sakigawa | G02B 6/4246 398/128 |
| 8,705,975 | B2 * | 4/2014 | Chen | G02B 6/4246 398/139 |
| 8,992,100 | B2 * | 3/2015 | Lim | G02B 6/4263 385/88 |
| 9,020,308 | B2 * | 4/2015 | Lim | G02B 6/3628 385/16 |
| 9,052,235 | B2 * | 6/2015 | Rossinger | G01J 5/0893 |
| 9,250,401 | B2 * | 2/2016 | Lim | G02B 6/4215 |
| 9,264,135 | B2 * | 2/2016 | Chi | H04B 10/07957 |
| 9,372,315 | B2 * | 6/2016 | Miao | G02B 6/421 |
| 9,541,714 | B2 * | 1/2017 | Lim | G02B 6/4246 |
| 9,692,522 | B2 * | 6/2017 | Pfnuer | H04B 10/676 |
| 10,168,500 | B2 * | 1/2019 | Amit | H04B 10/58 |
| 10,191,232 | B2 * | 1/2019 | Hwang | G02B 6/4215 |
| 10,409,015 | B1 * | 9/2019 | Lu | G02B 6/4215 |
| 10,444,359 | B2 * | 10/2019 | Pacala | G02B 26/10 |
| 10,480,993 | B2 * | 11/2019 | Hsu | G01J 9/0246 |
| 10,746,933 | B2 * | 8/2020 | Guo | G02B 6/2938 |
| 11,262,512 | B2 * | 3/2022 | Li | H04B 10/40 |
| 2002/0024916 | A1 * | 2/2002 | Ueyama | G11B 7/1275 |
| 2002/0176662 | A1 * | 11/2002 | Melchior | G02B 6/4246 385/88 |
| 2003/0128916 | A1 * | 7/2003 | Sasaki | G02B 6/4286 385/24 |
| 2003/0138198 | A1 * | 7/2003 | Plickert | G02B 6/29368 385/38 |
| 2003/0151818 | A1 * | 8/2003 | Wagner | G02B 6/4206 359/578 |
| 2004/0146304 | A1 * | 7/2004 | Kuhara | G02B 6/4206 398/138 |
| 2004/0179784 | A1 * | 9/2004 | Vancoille | G02B 6/4214 385/47 |
| 2006/0013541 | A1 * | 1/2006 | Plickert | G02B 6/4246 385/47 |
| 2006/0088255 | A1 * | 4/2006 | Wu | G02B 6/4215 385/92 |
| 2006/0152726 | A1 * | 7/2006 | Larsen | G01J 3/42 356/416 |
| 2007/0146881 | A1 * | 6/2007 | Tanaka | G02B 6/4246 359/485.06 |
| 2010/0086262 | A1 * | 4/2010 | Kihara | G02B 6/4239 385/89 |
| 2010/0209103 | A1 * | 8/2010 | Sakigawa | G02B 6/4214 398/45 |
| 2010/0226655 | A1 * | 9/2010 | Kim | H01S 5/02325 398/139 |
| 2010/0290128 | A1 * | 11/2010 | Sugitatsu | G02B 27/145 359/634 |
| 2011/0044696 | A1 * | 2/2011 | Lim | H04B 10/40 398/139 |
| 2011/0058771 | A1 * | 3/2011 | Lee | G02B 6/4215 385/33 |
| 2011/0085767 | A1 * | 4/2011 | Miao | G02B 6/4267 385/88 |
| 2013/0034357 | A1 * | 2/2013 | Lim | G02B 6/4257 398/79 |
| 2013/0089337 | A1 * | 4/2013 | Kim | G02B 6/4246 398/139 |
| 2013/0108262 | A1 * | 5/2013 | Lim | G02B 6/4215 398/43 |
| 2013/0272665 | A1 * | 10/2013 | Lim | G02B 6/4214 385/92 |
| 2014/0291521 | A1 * | 10/2014 | Rossinger | G01J 5/06 250/353 |
| 2014/0346323 | A1 * | 11/2014 | Fujimura | G02B 6/4265 250/208.2 |
| 2015/0030042 | A1 * | 1/2015 | Kim | H01S 5/0687 372/20 |
| 2015/0136957 | A1 * | 5/2015 | Iemura | G01J 1/0411 250/208.2 |
| 2016/0004019 | A1 * | 1/2016 | Joerg-Reinhardt | G02B 6/4214 385/39 |
| 2016/0154194 | A1 * | 6/2016 | Kim | G02B 6/29395 385/33 |
| 2016/0223393 | A1 * | 8/2016 | Hsu | G01J 9/0246 |
| 2016/0323038 | A1 * | 11/2016 | Zhou | H04J 14/02 |
| 2016/0349470 | A1 * | 12/2016 | Cheng | G02B 6/4215 |
| 2017/0031100 | A1 * | 2/2017 | Yang | G02B 6/2938 |
| 2017/0085970 | A1 * | 3/2017 | Zhang | H04Q 11/0005 |
| 2017/0090121 | A1 * | 3/2017 | Wang | G02B 6/4206 |
| 2017/0261707 | A1 * | 9/2017 | Onaka | G02B 6/4295 |
| 2017/0315313 | A1 * | 11/2017 | Cheng | G02B 6/4245 |
| 2017/0371112 | A1 * | 12/2017 | Hwang | G02B 6/4208 |
| 2018/0210156 | A1 * | 7/2018 | Lin | G02B 6/4251 |
| 2019/0250336 | A1 * | 8/2019 | Guo | H04B 10/675 |
| 2020/0322061 | A1 * | 10/2020 | Li | H04B 10/2589 |
| 2021/0149129 | A1 * | 5/2021 | Wei | G02B 6/4213 |
| 2021/0263155 | A1 * | 8/2021 | Miller | H01L 27/14643 |
| 2022/0113478 | A1 * | 4/2022 | Kanai | G02B 6/421 |

OTHER PUBLICATIONS

"40-Gigabit-capable passive optical networks (NG-PON2): General requirements" Recommendation ITU-T G.989.1, Mar. 2013.

* cited by examiner

WAVELENGTH-SELECTION TYPE OPTICAL RECEIVING APPARATUS

CROSS-REFERENCE TO RELATED APPLICATIONS

This application is a 371 U.S. National Phase of International Application No. PCT/JP2020/003690 filed on Jan. 31, 2020, which claims priority to Japanese Application No. 2019-018954 filed on Feb. 5, 2019. The entire disclosures of the above applications are incorporated herein by reference.

TECHNICAL FIELD

The present invention relates to a wavelength-selective optical reception device that is applicable to an optical access system, for example.

BACKGROUND ART

The number of users of high-speed Internet through FTTH (Fiber To The Home) and mobile services continues to increase, and high-speed Internet has become indispensable to people's everyday lives. However, networks such as FTTH, mobile services, and so forth, are constructed independently for each service, and accordingly operation of networks making up FTTH, mobile services, and so forth is inefficient.

In order to make operation of networks such as FTTH, mobile services, and so forth more efficient, an optical access system that accommodates a plurality of services in a single system has been proposed (e.g., see NPL 1). Also, WDM (Wavelength Division Multiplex)/TDM (Time Division Multiplexing)-PON (Passive Optical Networks) that uses a plurality of wavelengths is standardized in ITU-T (International Telecommunication Union Telecommunication Standardization Sector), to realize an access network capable of accommodating a plurality of services (e.g., see NPL 2).

In WDM/TDM-PON, a plurality of optical signals having different wavelength channels from each other is wavelength-multiplexed and transmitted. In order to realize WDM/TDM-PON, there is a need for an optical reception device that is able to receive only optical signals of a desired wavelength from the plurality of wavelength channels. Also, changing transmission/reception wavelength in accordance with the situation is assumed in WDM/TDM-PON, and optical reception devices need wavelength selection functions.

In order to enable only optical signals of a desired wavelength to be selected and received, wavelength-variable filters are mounted in optical reception devices for WDM/TDM-PON. Wavelength-variable filters include optical bandpass filters that transmit only a desired waveband, for example.

CITATION LIST

Non Patent Literature

[NPL 1] S. Kimura, "WDM/TDM-PON Technologies for Future Flexible Optical Access Networks," 15th OptoElectronics and Communications Conference (OECC 2010) Tech. Digest, 6A1-1 (Invited), pp. 14-15 (2010).

[NPL 2] ITU-T G-SERIES RECOMMENDATIONS: TRANSMISSION SYSTEMS AND MEDIA, DIGITAL SYSTEMS AND NETWORKS (Digital sections and digital line system—Optical line systems for local and access networks) (2013).

SUMMARY OF THE INVENTION

Technical Problem

Conventional wavelength-selective optical reception devices often use transmissive wavelength-variable filters. Transmissive wavelength-variable filters transmit light of a desired wavelength, and reflect light of wavelengths other than the light of the desired wavelength. However, there has been a problem in that light reflected at the wavelength-variable filter exhibits scattered reflection within the optical reception devices and becomes stray light, which can cause noise. There also is a problem in that reception characteristics of the wavelength-selective optical reception device deteriorates due to noise caused by such stray light, and there has been demand for improved reception characteristics.

The configuration of a wavelength-selective optical reception device 90, which is an example of a conventional wavelength-selective optical reception device, is illustrated in FIG. 8. Wavelength-multiplexed optical signals 203 exit a plane of exit 103 of a core 102 of an optical fiber 101 illustrated in FIG. 8. The wavelength-multiplexed optical signals 203 spread along an optical axis 205, enter a condensing lens 111, exit along the optical axis 205, and are received at a photoreceptor 21. The focal length of the condensing lens 111 and the distance from the condensing lens 111 to the photoreceptor 21 are decided such that a beam waist 211 (i.e., convergence point) is situated at a light-receiving face 22 of the photoreceptor 21. Out of the wavelength-multiplexed optical signals 203, optical signals 201 that are the object of reception are modulated by unprescribed data, and are converted into electrical signals at the photoreceptor 21, and thereafter decoded as data.

The wavelength-multiplexed optical signals 203 output from the optical fiber 101 include light of a plurality of wavelengths or wavebands (hereinafter, may simply be referred to as wavelengths). One wavelength is assigned to one wavelength channel, and lights of a plurality of wavelengths different from each other are encoded by data corresponding to each wavelength channel. If lights of a plurality of wavelengths included in the wavelength-multiplexed optical signals 203 enter the photoreceptor 21 at the same time, the data will become mixed, and the data that is the object of reception cannot be accurately decoded. The wavelength-selective optical reception device 90 is provided with an optical filter 61 that only transmits the wavelength of the optical signals 201, disposed on the optical axis 205, between the condensing lens 111 and the photoreceptor 21, in order to enable just the optical signals 201 of the desired wavelength to be received out of the wavelength-multiplexed optical signals 203. The optical filter 61 is a wavelength filter formed of a dielectric multilayer film, for example. Optical signals 202 that are wavelengths other than the wavelength of the optical signals 201 in the wavelength-multiplexed optical signals 203 are reflected by the optical filter 61, and do not enter the photoreceptor 21.

In the wavelength-selective optical reception device 90, the photoreceptor 21 is provided on an installation face 32 of a base 31. Further, a cap (housing) 91 is provided on the installation face 32, with the photoreceptor 21 and the optical filter 61 being enclosed by the installation face 32 and the cap 91. A wall face 92 of the cap 91 facing the installation face 32 is situated between the condensing lens 111 and the optical filter 61. The wall face 92 is provided with a window 221 that has generally the same size as that of a passage region 213 of the wavelength-multiplexed optical signals 203. The wavelength-multiplexed optical signals 203 exiting the condensing lens 111 pass through the window 221 and enter the optical filter 61. According to the above-described configuration, mixing of the optical signals 201 and 202 can be prevented, and data of the optical signals 201 can be decoded from the electrical signals output from the photoreceptor 21.

As described above, the optical signals 202 are reflected without being transmitted through the optical filter 61. The cap 91 for sealing is commonly formed of a metal such as aluminum or the like to ensure strength, and accordingly, the optical signals 202 reflected at the optical filter 61 are reflected again at the inner side of the cap 91, as illustrated in FIG. 8. The optical signals 202 reflected at the inner side of the cap 91 become stray light 207 and enter the photoreceptor 21, causing noise to be generated when decoding the data from the optical signals 201. The greater the number of wavelengths included in the wavelength-multiplexed optical signals 203, more the number of wavelength channels can be expanded. However, the power of the stray light 207 increases in accordance with the number of wavelengths of optical signals 202. Thus, the optical signals 202 reflected at the inner side of the cap 91 become a large noise source. That is to say, the optical signals 202 reflected at the inner side of the cap 91 causes marked deterioration of reception characteristics of the wavelength-selective optical reception device 90.

With the forgoing in view, it is an object of the present invention to provide a wavelength-selective optical reception device that prevents stray light from being generated due to light reflected at a wavelength-variable filter (optical filter), and that enables reception characteristics to be improved.

Means for Solving the Problem

The wavelength-selective optical reception device according to the present invention includes a photoreceptor that converts first optical signals into electric signals and outputs the electric signals, a base on which the photoreceptor is provided, a housing that is mounted on the base and surrounds the photoreceptor along with the base, and that is provided with a first window to pass third optical signals including the first optical signals and including second optical signals of a wavelength different from a first wavelength of the first optical signals, and a first optical filter that is disposed inside the housing between the first window and the photoreceptor along an optical axis of the third optical signals, and that outputs, out of the third optical signals that enter thereto, the first optical signals toward the photoreceptor, and reflects the second optical signals toward a near side in a direction of travel of the third optical signals. A second window is provided in the housing to pass the second optical signals.

In the wavelength-selective optical reception device according to the present invention, the first window and the second window may be adjacent to each other along a wall face of the housing.

In the wavelength-selective optical reception device according to the present invention, the first window and the second window may be separated from each other along a wall face of the housing.

In the wavelength-selective optical reception device according to the present invention, the first optical filter may be a wavelength-variable filter capable of optionally changing the first wavelength.

In the wavelength-selective optical reception device according to the present invention, the first wavelength may be changed by changing an angle of the first optical filter as to the optical axis of the third optical signals.

The wavelength-selective optical reception device according to the present invention may further include a condensing lens that condenses the first optical signals exiting the first optical filter on a light-receiving face of the photoreceptor.

The wavelength-selective optical reception device according to the present invention may further include a light-emitting element that outputs transmission optical signals, and a second optical filter that is disposed inside the housing, between the first window and the first optical filter along the optical axis of the third optical signals, and that outputs the third optical signals toward the first optical filter, and outputs the transmission optical signals toward the first window.

Effects of the Invention

According to the present invention, a wavelength-selective optical reception device can be provided that that prevents stray light from being generated due to light reflected at a wavelength-variable filter, and that enables reception characteristics to be improved.

DESCRIPTION OF EMBODIMENTS

Figure 1:
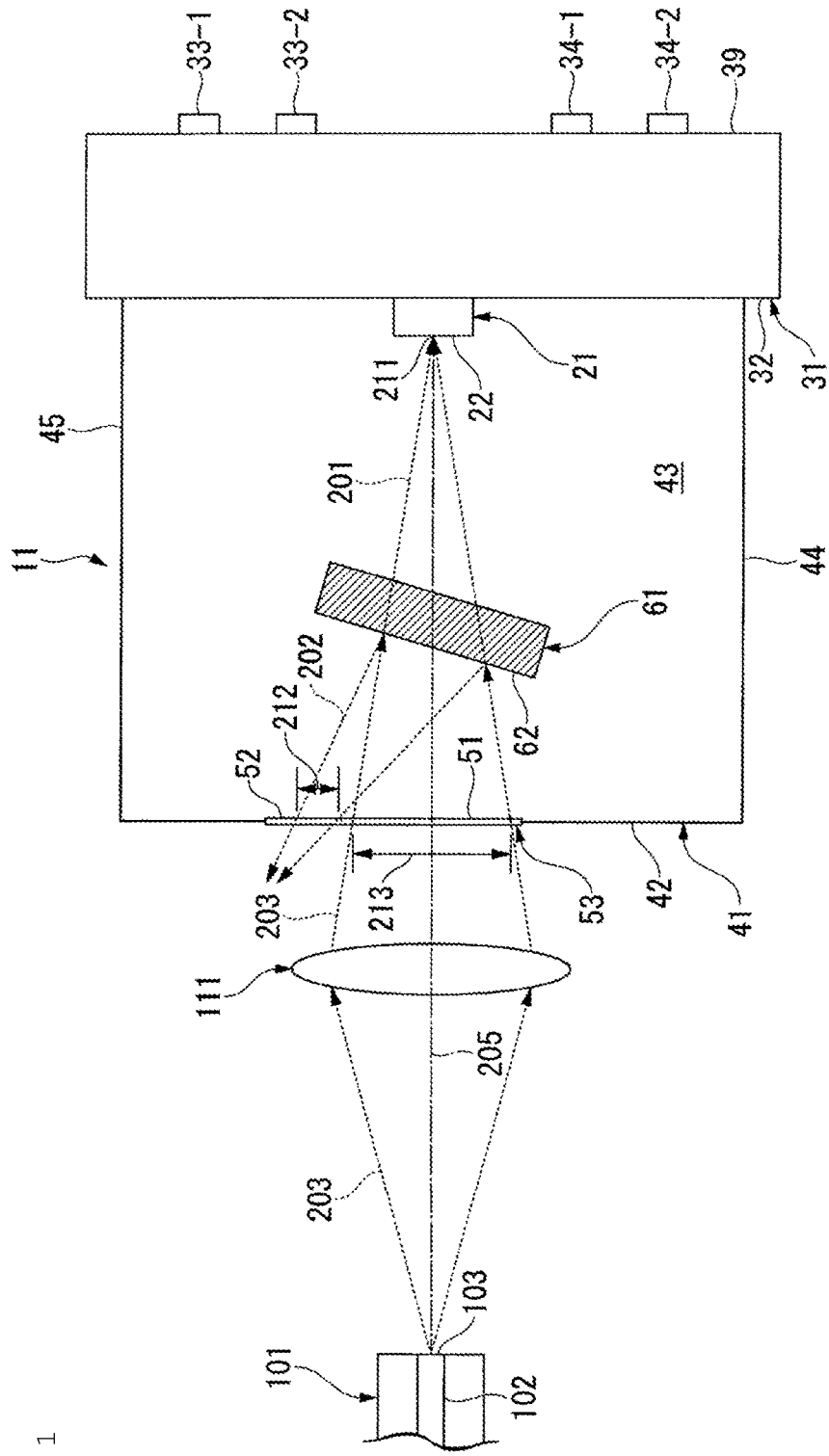
FIG. 1 is a planar view of a wavelength-selective optical reception device according to a first mode of a first embodiment of the present invention.

Embodiments of a wavelength-selective optical reception device according to the present invention will be described below with reference to the figures. Note that in the present specification and in the figures, configurations that have the same function are denoted by the same signs, and repetitive description will be omitted.

First Embodiment

A wavelength-selective optical reception device 11 according to a first mode of a first embodiment of the present invention is used in an optical access system to provide FTTH, mobile services, or the like, for example. An optical fiber 101 illustrated in FIG. 1 transmits wavelength-multiplexed optical signals 203 including a plurality of wavelength channels of light in an optical access system. Wavelength-multiplexed optical signals 203 including lights of different wavelengths or wavebands from each other exit a plane of exit 103 of a core 102 of the optical fiber 101. Wavelength channels that are different from each other are allocated to lights of wavelengths or wavebands that are different from each other, included in the wavelength-multiplexed optical signals 203. The lights of wavelengths or wavebands that are different from each other, included in the wavelength-multiplexed optical signals 203, are encoded by data in accordance with the wavelength channels.

A condensing lens 111 and the wavelength-selective optical reception device 11 are situated ahead in the direction of travel of the wavelength-multiplexed optical signals 203 from the plane of exit 103, along the optical axis 205 of the wavelength-multiplexed optical signals 203 exiting the plane of exit 103. The wavelength-multiplexed optical signals 203 exiting the plane of exit 103 spread along the optical axis 205 and enter the condensing lens 111. The wavelength-multiplexed optical signals 203 exiting the condensing lens 111 are condensed along the optical axis 205.

The wavelength-selective optical reception device 11 is provided with a photoreceptor 21, a base 31, a housing 41, and an optical filter (first optical filter) 61, as illustrated in FIG. 1.

The photoreceptor 21 receives optical signals (first optical signals) 201 of a wavelength channel that is the object of reception, out of the wavelength-multiplexed optical signals (third optical signals) 203 exiting the condensing lens 111, convert the optical signals 201 into electrical signals, and output the converted electrical signals. The photoreceptor 21 is a photodiode, for example.

The photoreceptor 21 is provided on a predetermined installation face 32 of the base 31. A pair of electrodes 33-1 and 33-2 that outputs electric signals output from the photoreceptor 21 to the outer side of the base 31 is provided on an electrode face 39 that is on the opposite side of the base 31 from the installation face 32 and on the outer side of the housing 41. The photoreceptor 21 and the electrodes 33-1 and 33-2 are electrically connected. Also provided to the electrode face 39 is a pair of electrodes 34-1 and 34-2 that drives an actuator (omitted from illustration) to rotate the optical filter 61. The actuator and the electrodes 34-1 and 34-2 are electrically connected. The base 31 may be a circuit board, a metal board, or the like, for example, and may be part of a device other than the wavelength-selective optical reception device 11 on the optical access system. The distance between the condensing lens 111 and the photoreceptor 21 on the optical axis 205 is decided such that a beam waist 211 of the optical signals 201 is situated on a light-receiving face 22 of the photoreceptor 21, in accordance with the focal length of the condensing lens 111.

The housing 41 is installed on the base 31, seals off at least a part of the installation face 32 including a region where the photoreceptor 21 is provided, and surrounds the photoreceptor 21 along with the base 31. The housing 41 is formed as a bottomless box having an opening that comes into contact with the installation face 32, and has a side wall face that is cylindrical in form, for example, making up wall faces 44 and 45 with a wall face 42 as a top face.

A window (first window) 51 for passing the wavelength-multiplexed optical signals 203 is provided to the wall face 42 that faces the installation face 32 and is orthogonal to the optical axis 205 in the housing 41. The wavelength-multiplexed optical signals 203 include the optical signals 201, and optical signals (second optical signals) 202 of a wavelength that is different from a first wavelength of the optical signals 201. The window 51 has a size that is generally the same as a passage region 213 of the wavelength-multiplexed optical signals 203 along the wall face 42.

The optical filter 61 is disposed on an inner portion 43 of the housing 41, along the optical axis 205 between the window 51 and the photoreceptor 21. The optical filter 61 outputs, out of the wavelength-multiplexed optical signals 203 entering thereto, the optical signals 201 toward the photoreceptor 21, and reflects the optical signals 202 toward the near side in the direction of travel of the wavelength-multiplexed optical signals 203. That is to say, the optical filter 61 is provided to manifest wavelength selection functions of the wavelength-selective optical reception device 11.

The optical filter 61 is not limited in particular, as long as an optical element that outputs the optical signals 201 toward the photoreceptor 21 and reflects the optical signals 202 toward the near side in the direction of travel of the wavelength-multiplexed optical signals 203, and is a dielectric multilayer film or reflective diffraction grating, for example. In the first mode, the optical filter 61 is assumed to be a dielectric multilayer film fabricated in accordance with the first wavelength. The optical filter 61 may also be a bandpass filter, a long-pass filter or short-pass filter of the like that transmits only light of a wavelength longer or shorter than a particular wavelength, or the like, as long as it is able to output the optical signals 201 toward the photoreceptor 21.

An incidence face 62 of the optical filter 61 is inclined as to the optical axis 205 and as to a direction orthogonal to the optical axis 205. Due to the optical filter 61 being disposed in this way, the optical signals 202 reflected from the optical filter 61 are reflected toward the near side in the direction of travel of the wavelength-multiplexed optical signals 203, and in a direction forming a predetermined angle as to the optical axis 205, centered on the point of intersection of the optical axis 205 and the incidence face 62.

In addition to the window 51, a window (second window) 52 is provided to the wall face 42. The window 52 has a size generally the same as a passage region 212 of the optical signals 202 along the wall face 42. In the first mode, the optical signals 202 pass through a region adjacent to the wavelength-multiplexed optical signals 203 in a direction along the wall face 42, and accordingly the passage regions 212 and 213 are adjacent to each other. An example is illustrated in FIG. 1 where the windows 51 and 52 are adjacent to each other along the wall face 42, making up one large window 53.

The housing 41 excluding the windows 51 and 52 is formed of a material capable of shielding external light that might cause noise at the photoreceptor 21. Examples of such a material include metal such as aluminum, stainless steel (SUS), and so forth, ceramics, and the like.

The windows 51 and 52 are formed of a plate-like material that transmits light of the waveband of the wavelength-multiplexed optical signals 203. If the waveband of the wavelength-multiplexed optical signals 203 is not less than 1260 nm and not more than 1650 nm, quartz glass, BK-7, and so forth, for example, can be listed as materials of the windows 51 and 52. The materials of the windows 51 and 52 may differ from each other, as long as the above-described conditions are satisfied. Note that the windows 51, 52, and 53 may be an opening formed in the wall face 42, and do not have to be provided with a plate-like material or the like.

According to the wavelength-selective optical reception device 11 described above, the window 52 is provided in addition to the window 51, and the window 53 has a size of the passage regions 212 and 213 combined. Accordingly, the optical signals 202 reflected by the optical filter 61 exit to the outside of the housing 41 without being reflected at the inner portion 43. Thus, stray light can be prevented from occurring in the inner portion 43, and deterioration of reception characteristics of the wavelength-selective optical reception device 11 can be suppressed. In the wavelength-selective optical reception device 11, the wavelength-multiplexed optical signals 203 exiting the optical fiber 101 are condensed at the photoreceptor 21, and accordingly the optical signals 202 reflected by the optical filter 61 are also condensed along the optical axis. Thus, stray light in the inner portion 43 can be prevented from occurring without making the window 53 far larger than the size of the passage regions 212 and 213 combined, and deterioration of reception characteristics of the wavelength-selective optical reception device 11 can be suppressed.

The optical filter 61 formed of a dielectric multilayer film is a wavelength-variable filter that is able to control the waveband transmitted, by the angle as to the optical axis 205 regarding the wavelength-multiplexed optical signals 203 entering thereto being adjusted. In a case of using such a wavelength-variable filter as the optical filter 61, the sizes of the windows 52 and 53 are decided in accordance with the maximum operating angle of the wavelength-variable filter and the angle formed between the optical axis of the optical signals 202 and the optical axis 205.

Figure 2:
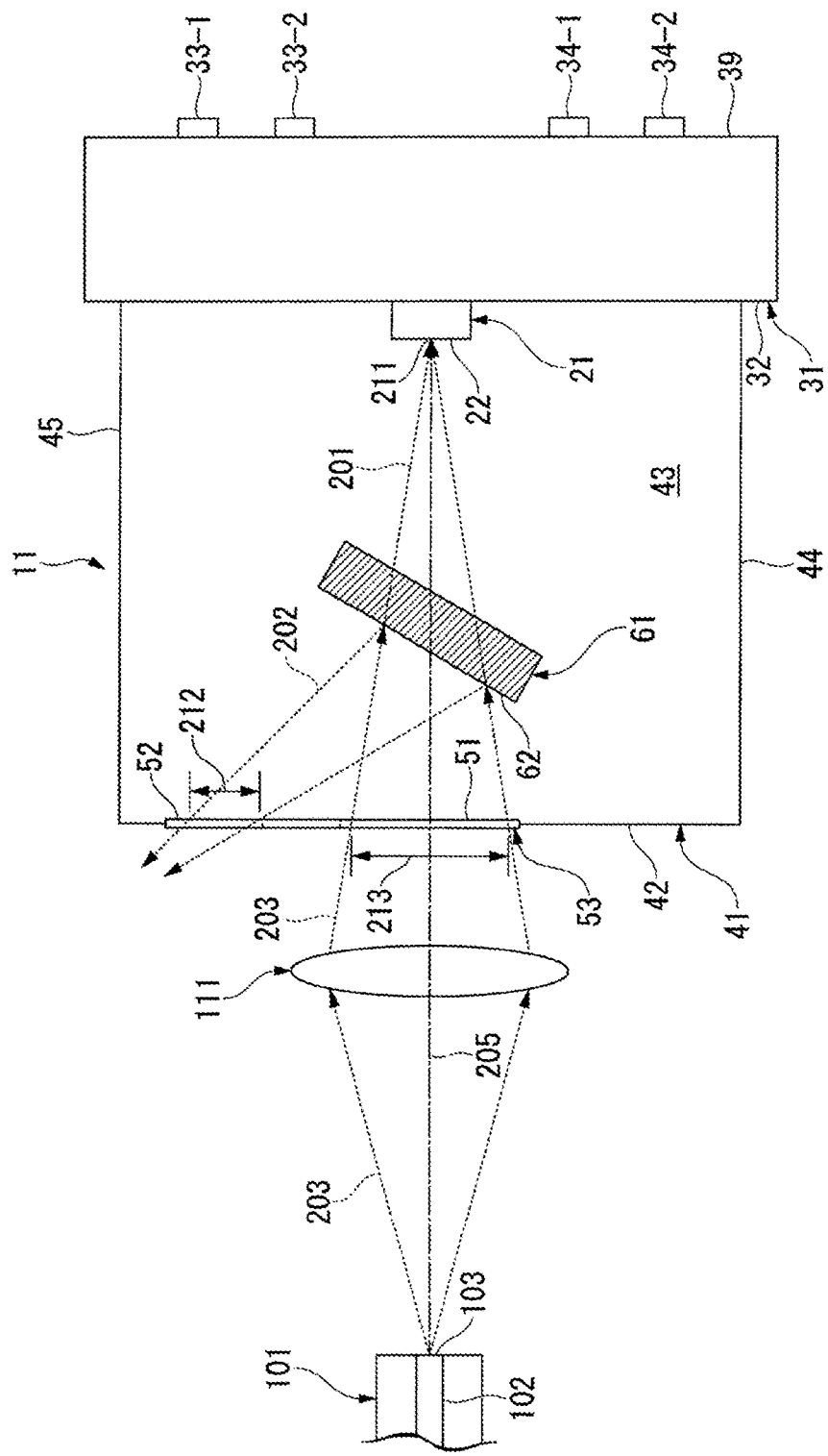
FIG. 2 is a planar view for describing the size of a window of the wavelength-selective optical reception device illustrated in FIG. 1.

When the angle of the optical filter 61 as to the optical axis 205 changes, the optical path of the optical signals 202 reflected at the optical filter changes around approximately twice the angle difference of the optical filter 61 before the change and after the change. As illustrated in FIG. 2, when the angle formed between the optical axis 205 and the incidence face 62 of the optical filter 61 (hereinafter, the angle of the optical filter 61 as to the optical axis 205) is smaller than the angle illustrated in FIG. 1, the passage region 212 increases in size, and the distance of separation between the passage regions 212 and 213 also becomes longer. With this in mind, by adjusting the size of the window 52 in accordance with the size of the passage region 212 and the angle of the optical filter 61 as to the optical axis 205 for optimal design, occurrence of stray light in the inner portion 43 can be suppressed even if the angle of the optical filter 61 as to the optical axis 205 or the orientation of the optical filter 61 changes.

Even if the waveband or first wavelength of light included in the wavelength-multiplexed optical signals 203 changes, the wavelength-selective optical reception device 11 can be used in an optical access system without greatly changing the configuration thereof, due to the optical filter 61 being a wavelength-variable filter of which the first wavelength can be optionally changed.

Also, the first wavelength that is the object of reception can be easily changed, by changing the angle of the optical filter 61 as to the optical axis 205, thereby changing the first wavelength.

Figure 3:
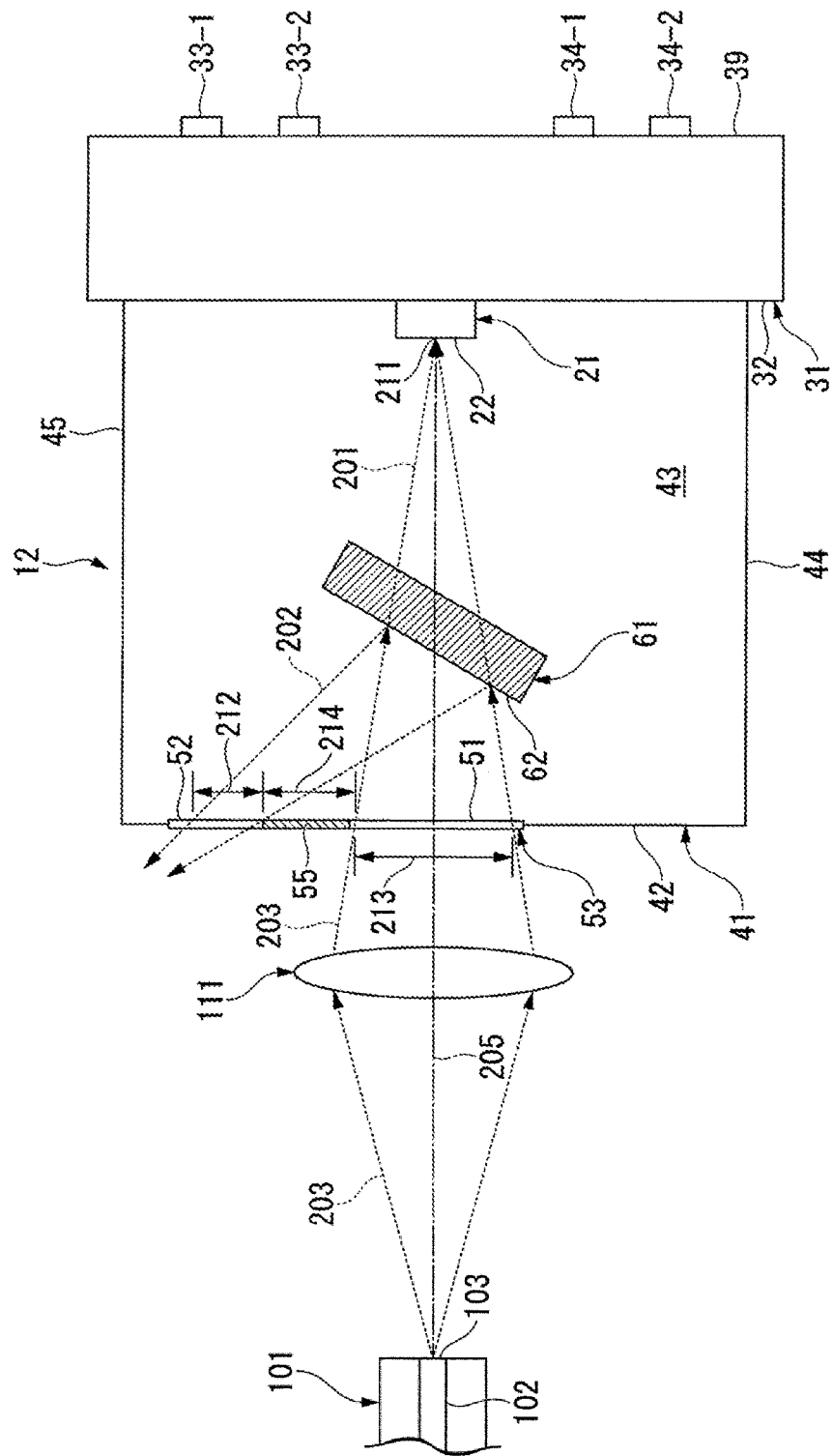
FIG. 3 is a planar view of a wavelength-selective optical reception device according to a second mode of the first embodiment of the present invention.

Next, a wavelength-selective optical reception device 12 according to a second mode of the first embodiment of the present invention will be described. The wavelength-selective optical reception device 12 has the same configuration as the wavelength-selective optical reception device 11, as illustrated in FIG. 3. In the wavelength-selective optical reception device 12, the distance of separation between the passage regions 212 and 213 in the direction along the wall face 42 is greater as compared to the wavelength-selective optical reception device 11, and the passage regions 212 and 213 cannot be said to be adjacent to each other from an optical perspective. With this in mind, a shielding member 55 is provided in a region 214 of the window 53 between the passage regions 212 and 213, i.e., between the windows 51 and 52 where neither the wavelength-multiplexed optical signals 203 nor the optical signals 202 pass.

The shielding member 55 is a member that shields external light, or attenuates external light. In a case where the window 53 is formed of quartz glass, the shielding member 55 may be provided as a metal film that is formed by vapor deposition or the like on the surface of the region 214 of the quartz glass.

In a case where the optical signals 202 reflected by the optical filter 61 are greatly distanced from the passage region 213 from an optical perspective, and are reflected to a particular region of any one of the wall faces 42, 44, or 45 of the housing 41, the window 52 may be provided in the above particular region as a separate window from the window 51. In the case where the passage region 212 is greatly distanced from the passage region 213 from an optical perspective, as illustrated in FIG. 3, the window 52 may be provided as a separate window from the window 51, and the portion corresponding to the shielding member 55 may be formed of the same material as the housing 41.

According to the above-described wavelength-selective optical reception device 12, stray light can be prevented from being generated in the inner portion 43, and deterioration of reception characteristics can be suppressed, in the same way as with the wavelength-selective optical reception device 11.

Figure 4:
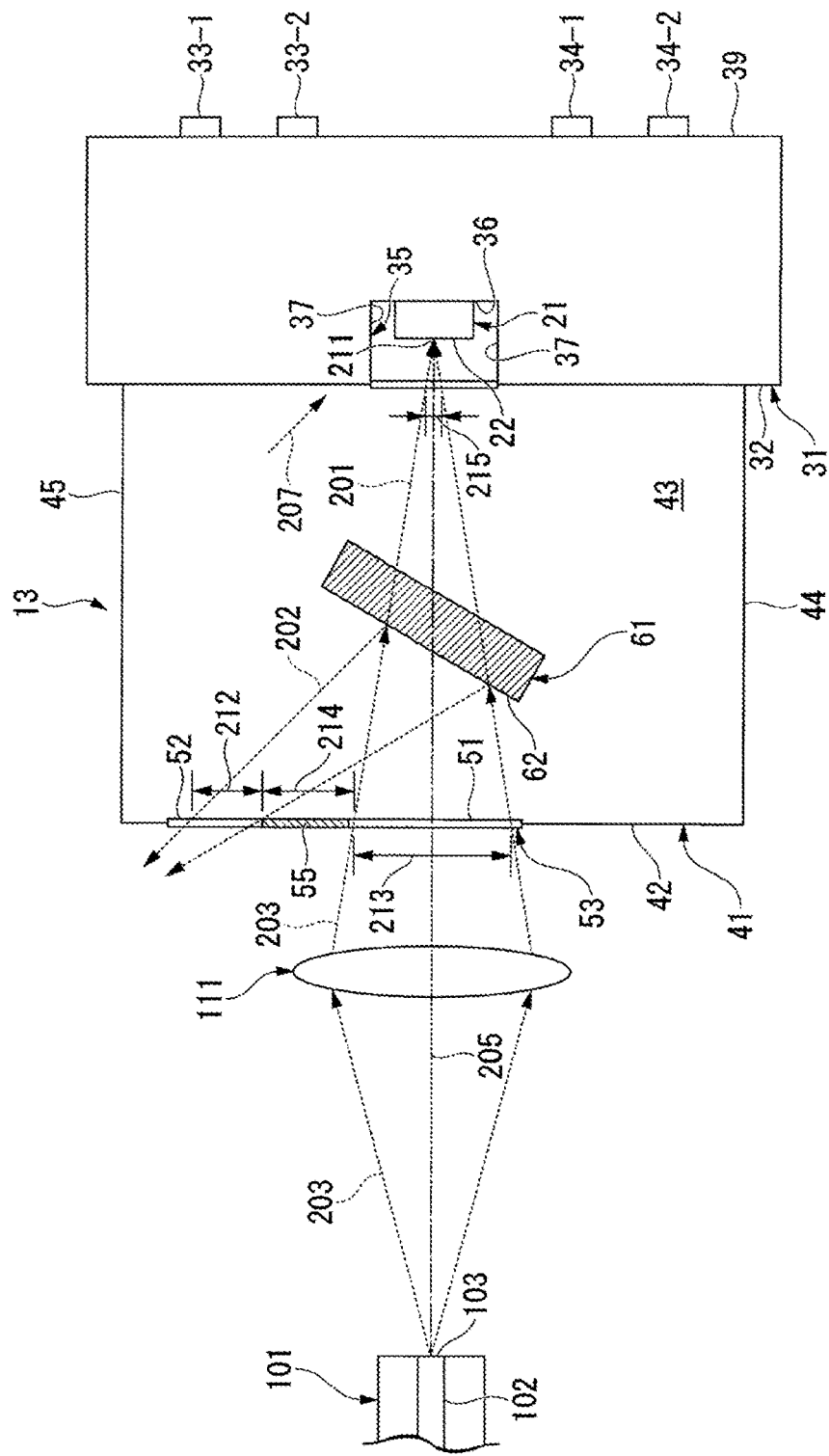
FIG. 4 is a planar view of a wavelength-selective optical reception device according to a third mode of the first embodiment of the present invention.

Next, a wavelength-selective optical reception device 13 according to a third mode of the first embodiment of the present invention will be described. The wavelength-selective optical reception device 13 has the same configuration as the wavelength-selective optical reception device 12, as illustrated in FIG. 4. Note however, that a case is conceivable in which the optical filter 61 shifts slightly from the original installation position when mounted, due to mounting precision in the wavelength-selective optical reception device 12. In such a case, the positional deviation of the optical filter 61 causes part of the optical signals 202 reflected at the optical filter 61 to be reflected into the inner portion 43 from any one of the wall faces 42, 44, and 45, instead of passing through the window 52, and a slight amount of stray light 207 is generated.

In the wavelength-selective optical reception device 13, a recess 35 is formed in the installation face 32 on the optical axis 205. The width of the recess 35 in the direction along the installation face 32 is larger than the width of the photoreceptor 21 and the passage region 215 of the optical signals 201. The depth of the recess 35 is greater than the height of the photoreceptor 21.

The photoreceptor 21 is disposed on a bottom face 36 of the recess 35. A cover 38 may be provided at the opening of the recess 35, so as to be approximately flush with the installation face 32. In such a case, the cover 38 is formed of a plate-like material that transmits light of the wavelength of the optical signals 201. Examples of the material of the cover 38 include quartz glass, BK-7, and so forth.

According to the above-described wavelength-selective optical reception device 13, even if a slight amount of stray light 207 is generated in the inner portion 43, the stray light 207 can be prevented from reaching the light-receiving face 22, by the installation face 32 around the recess 35 and side faces 37 of the recess 35. Thus, according to the wavelength-selective optical reception device 13, deterioration in reception characteristics can be suppressed more in comparison with the wavelength-selective optical reception device 12.

Formation of the recess 35, and disposing the photoreceptor 21 on the bottom face 36, may be applied to the wavelength-selective optical reception device 11. In such a case, advantageous effects can be obtained in that deterioration in reception characteristics of the wavelength-selective optical reception device can be suppressed more in comparison with the wavelength-selective optical reception device 11.

Figure 5:
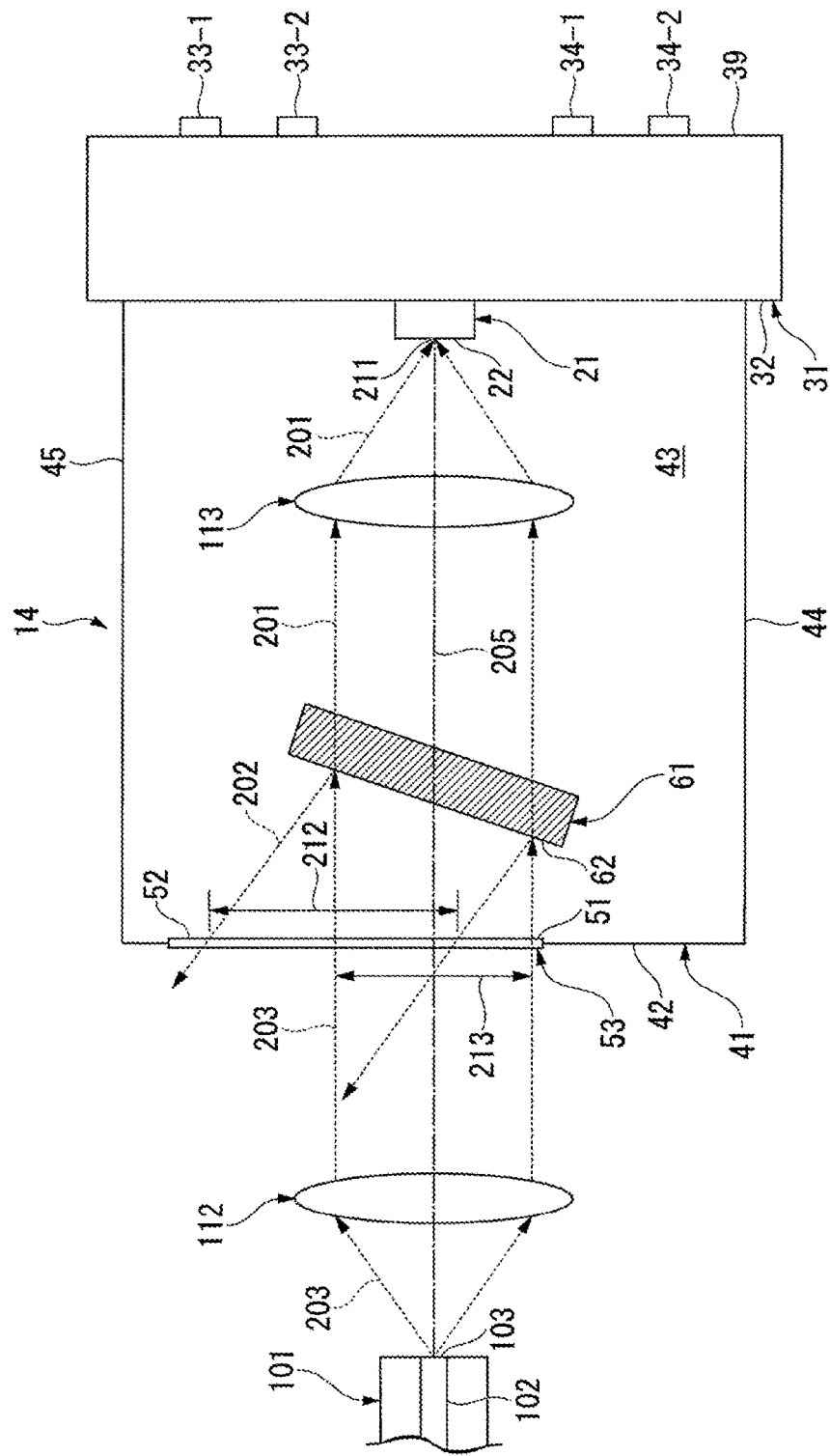
FIG. 5 is a planar view of a wavelength-selective optical reception device according to a fourth mode of the first embodiment of the present invention.

Next, a wavelength-selective optical reception device 14 according to a fourth mode of the first embodiment of the present invention will be described. In the wavelength-selective optical reception device 14, a collimator lens 112 is provided instead of the condensing lens 111 in the configuration of the wavelength-selective optical reception device 11, as illustrated in FIG. 5. The collimator lens 112 is disposed on the optical axis 205, at a distance corresponding to the focal length of the collimator lens 112, ahead in the direction of travel of the wavelength-multiplexed optical signals 203, from the plane of exit 103. A condensing lens 113 is also additionally provided between the optical filter 61 and the photoreceptor 21, in a direction along the optical axis 205. The distance of the condensing lens 113 from the light-receiving face 22 on the optical axis 205 is decided so that the beam waist 211 of the optical signals 201 is positioned on the light-receiving face 22 in accordance with the focal length of the condensing lens 113.

In the wavelength-selective optical reception device 14, the wavelength-multiplexed optical signals 203 exiting the plane of exit 103 are collimated by the collimator lens 112, and thereafter pass through the window 51 and enter the inner portion 43. The wavelength-multiplexed optical signals 203 entering the inner portion 43 enter the optical filter 61 in a collimated state. The optical signals 201 transmitted through the optical filter 61 and exiting the optical filter 61 ahead in the direction of travel of the wavelength-multiplexed optical signals 203 enter the condensing lens 113 in a collimated state, and are condensed on the light-receiving face 22 by the condensing lens 113. Meanwhile, the optical signals 202 reflected by the optical filter 61 pass through the window 52 in a collimated state, exit the housing 41 to the outside.

The passage regions 213 and 212 overlap each other along the wall face 42 in the wavelength-selective optical reception device 14, and the windows 51 and 52 can be configured as a single window 53, in the same way as in the wavelength-selective optical reception device 11. The sizes of the windows 52 and 53 are decided in accordance with the maximum operating angle of the optical filter 61 and the angle of the optical axis of the optical signals 202 as to the optical axis 205.

Thus, according to the above-described wavelength-selective optical reception device 14, stray light can be prevented from being generated in the inner portion 43, and deterioration of reception characteristics can be suppressed, in the same way as with the wavelength-selective optical reception device 11.

Note that in a case where the passage regions 213 and 212 do not overlap each other as described above, but are separated along the same wall face 42 by a certain distance, a member the same as the shielding member 55 may be provided between the passage regions 212 and 213, i.e., in a region between the windows 51 and 52 where neither the wavelength-multiplexed optical signals 203 nor the optical signals 202 pass, in the same way as with the wavelength-selective optical reception device 12.

Figure 6:
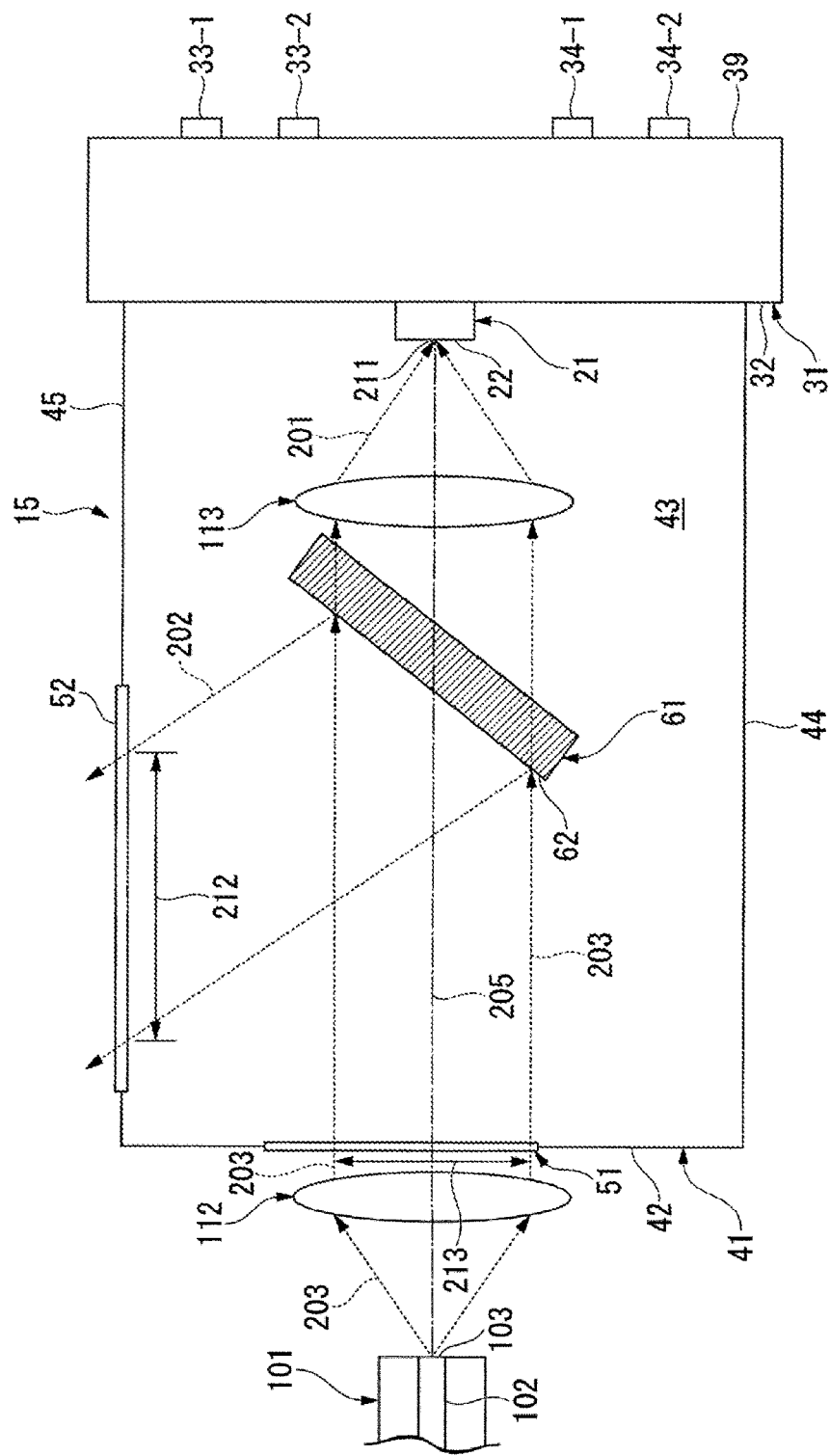
FIG. 6 is a planar view of a wavelength-selective optical reception device according to a fifth mode of the first embodiment of the present invention.
Figure 7:
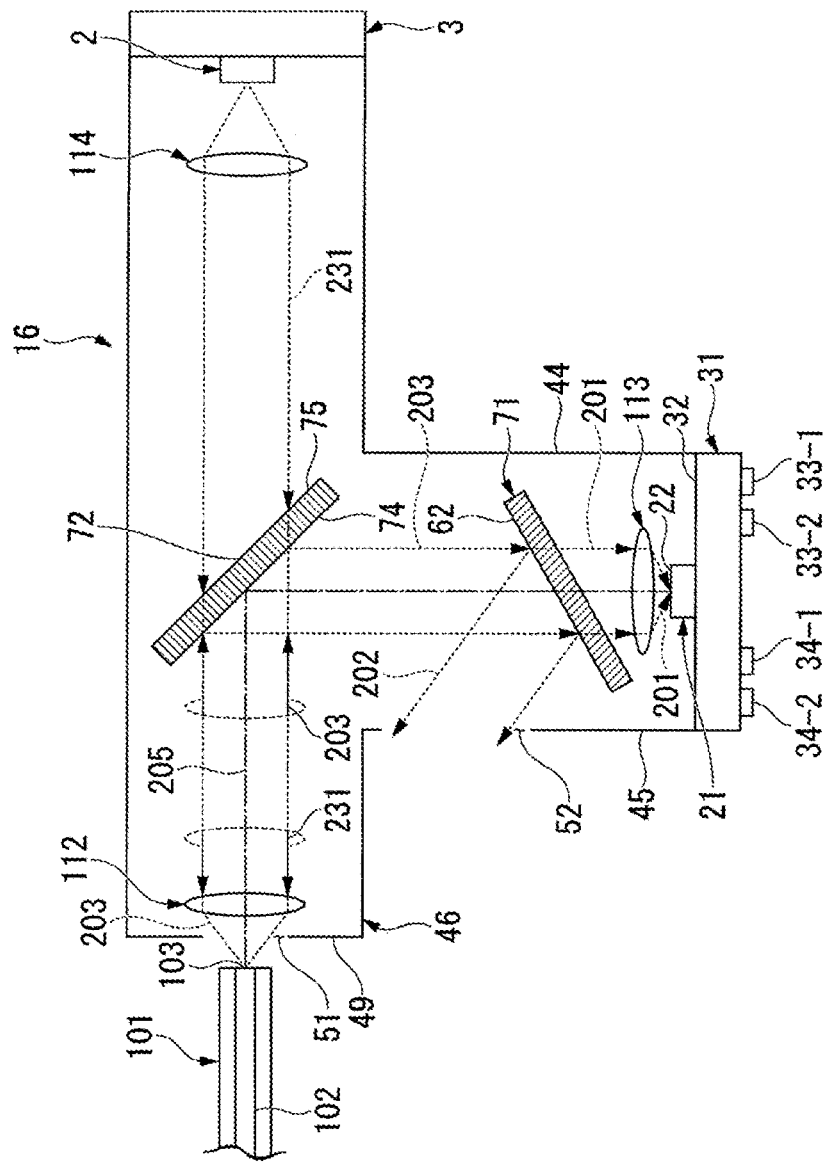
FIG. 7 is a planar view of a wavelength-selective optical reception device according to a second embodiment of the present invention.
Figure 8:
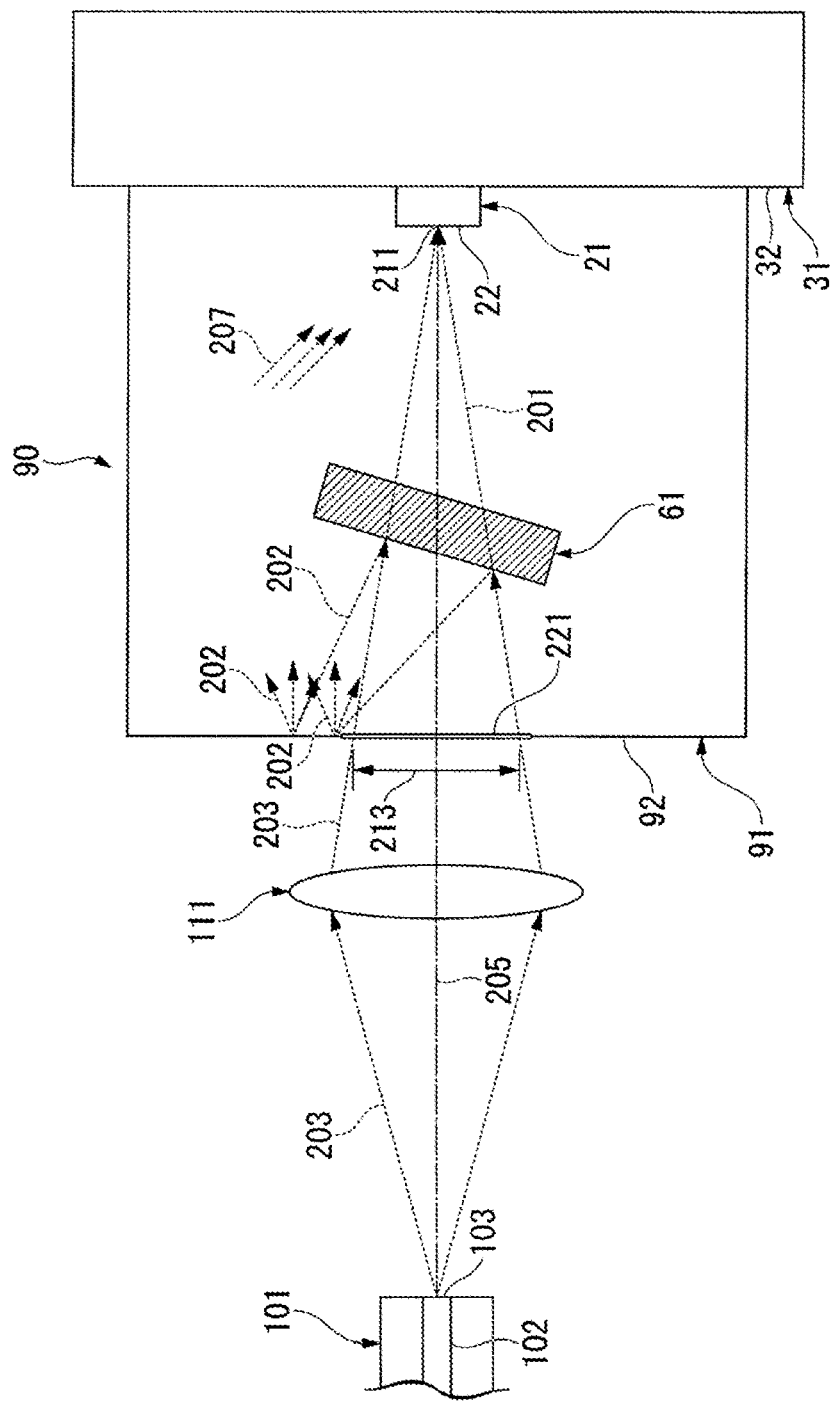
FIG. 8 is a planar view of a conventional wavelength-selective optical reception device.

Next, a wavelength-selective optical reception device 15 according to a fifth mode of the first embodiment of the present invention will be described. In the wavelength-selective optical reception device 15, the angle of the optical filter 61 as to the optical axis 205 is adjusted in the configuration of the wavelength-selective optical reception device 14, and the angle is smaller than that of the wavelength-selective optical reception device 14, as illustrated in FIG. 6.

The angle of the optical filter 61 as to the optical axis 205 is adjusted such that the passage region 212 is away from the passage region 213 by a considerable amount and is situated on the wall face 45 from an optical perspective. Accordingly, the window 52 is provided as a separate window from the window 51, at the passage region 212 along the wall face 45.

According to the above-described wavelength-selective optical reception device 15, the optical signals 202 are reflected toward the wall face 45 by the optical filter 61, pass through the window 52, and exit the housing 41 to the outside, and accordingly do not reflect into the inner portion 43 at the wall face 45, whereby stray light can be prevented from being generated in the inner portion 43. Thus, deterioration of reception characteristics of the wavelength-selective optical reception device 15 can be suppressed. Also, providing the windows 51 and 52 on different wall faces 42 and 45 of the housing 41 enables the size of the housing 41 to be reduced.

Note that the condensing lens 111 in the first through third modes, and the collimator lens 112 in the fourth and fifth modes, may each be disposed in the inner portion 43 of the housing 41.

Second Embodiment

Next, a wavelength-selective optical transmission/reception device (wavelength-selective optical reception device) 16 according to a second embodiment of the present invention will be described. The wavelength-selective optical transmission/reception device 16 is used in an optical access system for providing, for example, FTTH, mobile services, and so forth, in the same way as the wavelength-selective optical reception device 11 and so forth in the first embodiment. The wavelength-selective optical transmission/reception device 16 includes, in addition to the photoreceptor 21, the base 31, an optical filter (first optical filter) 71, and the condensing lens 113, a light-emitting element 2, a base 3, a housing 46 instead of the housing 41, the collimator lens 112, a condensing lens 114, and an optical filter (second optical filter) 72.

The optical filter 72 is disposed inside the housing 46, between the window 51 and the photoreceptor 21 on the optical axis 205, reflects (or transmits) incident light of the waveband of the wavelength-multiplexed optical signals 203 (second waveband), and transmits (or reflects) incident light of the waveband of transmission optical signals 231.

The optical filter 71 is disposed within the housing 46, between the optical filter 72 and the photoreceptor 21 along the optical axis 205. Out of the wavelength-multiplexed optical signals 203 output from the optical filter 72, the optical filter 71 outputs the optical signals 201 that are the object of reception toward the photoreceptor 21, and reflects the optical signals 202 toward the window 52. The optical filter 71 is a bandpass filter that transmits only optical signals 201 of the first wavelength.

The collimator lens 112 collimates the wavelength-multiplexed optical signals 203 entering the inside of the housing 46 through the window 51, and outputs the collimated signals toward the optical filter 72.

For the light-emitting element 2, a direct modulation laser, or an external modulation laser that uses an EA (Electro absorption) modulator, or the like, is used.

The housing 46 is formed in the shape of the letter T, for example. The shape of the housing 46 is decided as appropriate in accordance with the paths of the wavelength-multiplexed optical signals 203, the optical signals 201 and 202, and the transmission optical signals 231. The windows 51 and 52 are provided to wall faces 49 and 45 of the housing 46 that are different from each other, respectively.

The wavelength-multiplexed optical signals 203 exiting from the plane of exit 103 of the core 102 of the optical fiber 101 are collimated by the collimator lens 112, and thereafter reflected at a face 74 of the optical filter 72. The reflected wavelength-multiplexed optical signals 203 enter the optical filter 71 in the same way as the wavelength-multiplexed optical signals 203 that enter the optical filter 61 in the first embodiment. The optical signals 201 transmitted through the optical filter 71 enter the condensing lens 113 in a collimated state, and are condensed toward the photoreceptor 21 as they exit the condensing lens 113. The optical signals 201 received by the photoreceptor 21 are converted into electrical signals and are decoded as data.

Meanwhile, the transmission optical signals 231 are converted from predetermined electric signals into optical signals at the light-emitting element 2, and are emitted from the light-emitting element 2. The transmission optical signals 231 emitted from the light-emitting element 2 enter the optical filter 72 from a face 75 on the opposite side of the optical filter 72 from the face 74, traveling in a direction opposite to the direction of travel of the wavelength-multiplexed optical signals 203, and being transmitted through the optical filter 72. The transmission optical signals 231 transmitted through the optical filter 72 are condensed by the collimator lens 112, enter the core 102, and are transmitted over the optical fiber 101.

When lights of a plurality of wavelengths included in the wavelength-multiplexed optical signals 203 enters the photoreceptor 21 at the same time, the plurality of the optical signals will become mixed, and the data that is the object of reception cannot be accurately decoded. The wavelength-selective optical transmission/reception device 16 is provided with the optical filter 71, and accordingly only the optical signals 201 included in the wavelength-multiplexed optical signals 203 are transmitted through the optical filter 71 and received at the photoreceptor 21. Thus, the optical signals 202 can be prevented from entering the photoreceptor 21, and mixing of optical signals of a plurality of wavelength channels can be prevented. Also, data can be accurately decoded from the optical signals 201 converted into electrical signals at the photoreceptor 21.

Also, the optical signals 202 of a wavelength different from the wavelength of the optical signals 201 included in the wavelength-multiplexed optical signals 203 are reflected backwards in the direction of travel of the wavelength-multiplexed optical signals 203 by the optical filter 71, pass through the window 52, and exit the housing 46 to the outside. Thus, stray light from the optical signals 202 can be prevented from being generated inside the housing 46, and stray light can be prevented from entering the photoreceptor 21. The housing 46 is formed of a material such as metal or the like, and accordingly when the optical signals 202 are reflected at the inner side of the housing 46 as in conventional arrangements, stray light is generated, which is received at the photoreceptor 21 and causes noise to be generated when decoding data. The greater the number of wavelengths included in the optical signals 202, the greater the power of the stray light is. Conventionally, the optical signals 202 reflected at the inner side of the housing 46 has been a large noise source at the time of reception. Also, the optical signals 202 reflected at the inner side of the housing 46 has caused marked deterioration of reception characteristics of the conventional wavelength-selective optical transmission/reception devices.

That is to say, in the wavelength-selective optical transmission/reception device 16, the window 52 is provided at the portion of the wall face 45 of the housing 46 where the optical signals 202 reflected by the optical filter 71 are cast. By forming the window 52, the optical signals 202 reflected by the optical filter 71 are discharged to the outside of the housing 46 without reflecting at the wall face 45. Thus, generation of stray light inside the housing 46 can be prevented, and deterioration in reception characteristics of the wavelength-selective optical transmission/reception device 16 can be suppressed.

Note that in the wavelength-selective optical transmission/reception device 16, the collimator lens 112 may be disposed on the outside of the housing 46, between the window 51 and the plane of exit 103. Also, in a case where WDM technology is applied and the wavelength of the transmission optical signals 231 is variable, a laser having wavelength-variable functions, such as a DFB (distributed feedback) laser, a DBR (distributed-Bragg reflector) laser, or the like, may be used as the light-emitting element 2.

Although preferred embodiments of the present invention have been described above, the present invention is not limited to the above-described embodiments. Modifications and improvements of the configuration according to the present invention may be made within a scope in which objectives and advantages can be achieved. Specific configurations, forms, and so forth in carrying out the present invention may be other configurations, forms, and so forth, within a scope in which objectives and advantages of the present invention can be achieved.

For example, in a case where the windows 51 and 52 have plate-like materials or the like, and the inside of the housing 41 or 46 is in a closed state, an inert gas such as nitrogen or the like may be sealed therein.

REFERENCE SIGNS LIST

21 Photoreceptor
31 Base
41, 46 Housing
61, 71 Optical filter (first optical filter)
72 Optical filter (second optical filter)
51 Window (first window)
52 Window (second window)
11, 12, 13, 14, 15 Wavelength-selective optical reception device
16 Wavelength-selective optical transmission/reception device (wavelength-selective optical reception device)

The invention claimed is:

1. A wavelength-selective optical reception device, comprising:
 a photoreceptor that converts first optical signals into electric signals and outputs the electric signals;

a base on which the photoreceptor is provided;
a housing that is mounted on the base and surrounds the photoreceptor along with the base, and that is provided with a first window through which third optical signals pass from an outside of the housing to an inside of the housing, the third optical signals including the first optical signals and including second optical signals of a wavelength different from a first wavelength of the first optical signals; and
a first optical filter that is disposed inside the housing between the first window and the photoreceptor along an optical axis of the third optical signals, and that outputs, out of the third optical signals that enter thereto, the first optical signals toward the photoreceptor, and reflects the second optical signals toward a near side in a direction of travel of the third optical signals,
wherein a second window is provided at the housing, and the second optical signals pass through the second window from the inside of the housing to the outside of the housing,
the first window is either a first plate-like material or a first opening that is provided at a first position of an outer peripheral wall of the housing,
the second window is either a second plate-like material or a second opening that is provided at a second position of the outer peripheral wall of the housing, and
a shielding member is provided between the first window and the second window at a third position of the outer peripheral wall of the housing.

2. The wavelength-selective optical reception device according to claim 1,
wherein the first window and the second window are separated from each other via the shielding member along the outer peripheral wall of the housing.

3. The wavelength-selective optical reception device according to claim 1,
wherein the first optical filter is a wavelength-variable filter capable of optionally changing the first wavelength.

4. The wavelength-selective optical reception device according to claim 3,
wherein the first wavelength is changed by changing an angle of the first optical filter as to the optical axis of the third optical signals.

5. The wavelength-selective optical reception device according to claim 1, further comprising:
a condensing lens that condenses the first optical signals output from the first optical filter on a light-receiving face of the photoreceptor.

6. The wavelength-selective optical reception device according to claim 1, further comprising:
a light-emitting element that outputs the third optical signals toward the first window.

7. The wavelength-selective optical reception device according to claim 1,
wherein the housing is formed of a material including metal or ceramics to shield an external light different from the third optical signals, and
each of the first and second windows is formed of quartz glass.

8. The wavelength-selective optical reception device according to claim 1,
wherein the outer peripheral wall is configured with a top wall and a side wall,
the top wall is located at an opposite side with respect to the base, and the side wall connects between the top wall and the base, and
the first and second windows and the shielding member are provided at the top wall.

9. The wavelength-selective optical reception device according to claim 2,
wherein the outer peripheral wall is configured with a top wall and a side wall,
the top wall is located at an opposite side with respect to the base, and the side wall connects between the top wall and the base, and
the first and second windows and the shielding member are provided at the top wall.

10. A wavelength-selective optical reception device, comprising:
a photoreceptor that converts first optical signals into electric signals and outputs the electric signals;
a base on which the photoreceptor is provided;
a housing that is mounted on the base and surrounds the photoreceptor along with the base, and that is provided with a first window through which third optical signals pass from an outside of the housing to an inside of the housing, the third optical signals including the first optical signals and including second optical signals of a wavelength different from a first wavelength of the first optical signals; and
a first optical filter that is disposed inside the housing between the first window and the photoreceptor along an optical axis of the third optical signals, and that outputs, out of the third optical signals that enter thereto, the first optical signals toward the photoreceptor, and reflects the second optical signals toward a near side in a direction of travel of the third optical signals,
wherein a second window is provided at the housing, and the second optical signals pass through the second window from the inside of the housing to the outside of the housing,
the first window is a first plate-like material that is provided at a first position of an outer peripheral wall of the housing,
the second window is a second plate-like material that is provided at a second position of the outer peripheral wall of the housing, and
a shielding member is provided between the first window and the second window at a third position of the outer peripheral wall of the housing.

11. A wavelength-selective optical reception device, comprising:
a photoreceptor that converts first optical signals into electric signals and outputs the electric signals;
a base on which the photoreceptor is provided;
a housing that is mounted on the base and surrounds the photoreceptor along with the base, and that is provided with a first window through which third optical signals pass from an outside of the housing to an inside of the housing, the third optical signals including the first optical signals and including second optical signals of a wavelength different from a first wavelength of the first optical signals; and
a first optical filter that is disposed inside the housing between the first window and the photoreceptor along an optical axis of the third optical signals, and that outputs, out of the third optical signals that enter thereto, the first optical signals toward the photoreceptor, and reflects the second optical signals toward a near side in a direction of travel of the third optical signals, wherein a second window is provided at the housing, and the second optical signals pass through the second window from the inside of the housing to the outside of the housing, the first window is a first opening that is provided at a first position of an outer peripheral wall of the housing, the second window is a second opening that is provided at a second position of the outer peripheral wall of the housing, and a shielding member is provided between the first window and the second window at a third position of the outer peripheral wall of the housing.

12. The wavelength-selective optical reception device according to claim 1, wherein the first window, the shielding member, and the second window are continuously formed as a monolithic structure.

13. The wavelength-selective optical reception device according to claim 12, wherein the monolithic structure is formed of quartz glass.

14. The wavelength-selective optical reception device according to claim 13, wherein the shielding member is a metal film on the quartz glass.

15. The wavelength-selective optical reception device according to claim 2, wherein the first window, the shielding member, and the second window are continuously formed as a monolithic structure that is formed of quarts glass, and the shielding member is a metal film on the quartz glass.

16. The wavelength-selective optical reception device according to claim 3, wherein the first window, the shielding member, and the second window are continuously formed as a monolithic structure that is formed of quarts glass, and the shielding member is a metal film on the quartz glass.

17. The wavelength-selective optical reception device according to claim 5, wherein the first window, the shielding member, and the second window are continuously formed as a monolithic structure that is formed of quarts glass, and the shielding member is a metal film on the quartz glass.

18. The wavelength-selective optical reception device according to claim 6, wherein the first window, the shielding member, and the second window are continuously formed as a monolithic structure that is formed of quarts glass, and the shielding member is a metal film on the quartz glass.

19. The wavelength-selective optical reception device according to claim 7, wherein the first window, the shielding member, and the second window are continuously formed as a monolithic structure that is formed of quarts glass, and the shielding member is a metal film on the quartz glass.

20. The wavelength-selective optical reception device according to claim 8, wherein the first window, the shielding member, and the second window are continuously formed as a monolithic structure that is formed of quarts glass, and the shielding member is a metal film on the quartz glass.

* * * * *